(12) United States Patent
Kiple et al.

(10) Patent No.: US 9,643,364 B2
(45) Date of Patent: May 9, 2017

(54) MOLDED PARTS

(71) Applicant: Apple Inc., Cupertino, CA (US)

(72) Inventors: Bryan P. Kiple, Los Gatos, CA (US); Michael B. Wittenberg, Sunnyvale, CA (US); Dhaval N. Shah, Fremont, CA (US); Daniel W. Jarvis, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 470 days.

(21) Appl. No.: 14/245,834

(22) Filed: Apr. 4, 2014

(65) Prior Publication Data

US 2014/0220320 A1    Aug. 7, 2014

Related U.S. Application Data

(63) Continuation of application No. 13/399,947, filed on Feb. 17, 2012, now abandoned.

(51) Int. Cl.

| | |
|---|---|
| *B32B 3/10* | (2006.01) |
| *B29C 70/62* | (2006.01) |
| *B29C 45/16* | (2006.01) |
| *H05K 7/18* | (2006.01) |
| *B29K 105/16* | (2006.01) |
| *B29C 45/00* | (2006.01) |

(52) U.S. Cl.
CPC ............ *B29C 70/62* (2013.01); *B29C 45/164* (2013.01); *H05K 7/18* (2013.01); *B29C 45/0013* (2013.01); *B29K 2105/16* (2013.01); *Y10T 428/24802* (2015.01); *Y10T 428/24909* (2015.01); *Y10T 428/24926* (2015.01)

(58) Field of Classification Search
None
See application file for complete search history.

(56) References Cited

U.S. PATENT DOCUMENTS

| | | | |
|---|---|---|---|
| 3,888,612 A | | 6/1975 | Schrewe et al. |
| 3,950,483 A | * | 4/1976 | Spier .................... B29C 45/164 |
| | | | 264/241 |
| 4,210,616 A | | 7/1980 | Eckardt et al. |
| 5,799,385 A | | 9/1998 | Vecchiarino et al. |
| 5,953,880 A | | 9/1999 | De Zen |
| 6,355,197 B1 | | 3/2002 | Lausenhammer et al. |
| 7,004,739 B2 | | 2/2006 | Thomson |
| 7,310,193 B2 | | 12/2007 | Wulff et al. |
| 8,073,131 B2 | | 12/2011 | Bodkin et al. |
| 2004/0242803 A1 | * | 12/2004 | Ohme .................... C08L 67/04 |
| | | | 525/400 |
| 2007/0176322 A1 | | 8/2007 | Etter et al. |
| 2010/0078343 A1 | * | 4/2010 | Hoellwarth ....... B29C 45/14639 |
| | | | 206/320 |

(Continued)

FOREIGN PATENT DOCUMENTS

WO    WO 2004008722    1/2004

*Primary Examiner* — Christopher Polley
(74) *Attorney, Agent, or Firm* — Downey Brand LLP

(57) ABSTRACT

A method and apparatus for injection molding plastic parts is described. In one embodiment, at least two materials are simultaneously injected into a mold. The resulting molded part can include at least two different regions. Each region can have distinct physical properties. Positions of the regions within the molded part can be at least partially controlled by controlling flow fronts of the at least two materials within the mold.

20 Claims, 6 Drawing Sheets

(56) References Cited

U.S. PATENT DOCUMENTS

2010/0112267 A1    5/2010   Stenzel et al.
2012/0025415 A1    2/2012   Paulus et al.
2013/0214450 A1    8/2013   Kiple et al.

\* cited by examiner

MOLDED PARTS

CROSS-REFERENCE TO RELATED APPLICATIONS

This is a continuation of U.S. patent application Ser. No. 13/399,947 filed Feb. 17, 2012 entitled "METHOD AND APPARATUS FOR MOLDING PARTS," which is incorporated herein by reference in its entirety.

FIELD

The described embodiments relate generally injection molding and more particularly to injection molding plastic parts with non-homogenous material properties.

BACKGROUND

Injection molding, and injection molding plastic parts in particular, has become a very cost effective method for quickly manufacturing parts. Typically, a single plastic resin is selected and prepared for injection into the mold. The result is a plastic part with uniform physical properties.

Sometimes a part may be formed from two different plastic resins. In this scenario, a first material is injected, then after a predetermined time period (usually determined by the amount of time needed for the melted resin to set), a second material is injected. A common term of art used to describe this method is the "two shot" method. In this method, the first material is shot into the mold. The mold can be repositioned and then can receive the second material. The two shot method can have associated disadvantages. First of all, there is an increased cycle time to produce molded part. That is, in order for a complete part to be produced, it takes one cycle of for the first material, and then one cycle for the second material. Secondly, there is often a perceptible line at the interface of the two different materials. Oftentimes, this visible line may be undesirable.

There can be some designs when it is desirous for a single part to have varying physical properties. For example, a designer may want a first section or region of a part to have a first amount of stiffness, and a second section of the part to have a second amount of stiffness. Single shot injection molding typically only provides uniform physical properties throughout the entire part. On the other hand, a two shot process can introduce a second material (providing a second physical property) but with added cycle time, and therefore, added cost. Further, the resulting product may no longer be visually acceptable due to visible interface lines between the first and second materials.

Therefore, what is desired is a cost effective way to produce an injection molded part with non-uniform material characteristics in a short process.

SUMMARY

This paper describes various embodiments that relate to an injection molding method and apparatus. The methods and apparatus disclosed can produce plastic parts with non-uniform physical properties while appearing smooth and uniform.

In one embodiment, a method for molding a part includes selecting a first and a second material, simultaneously injecting the first and second materials and controlling the flow fronts of the first and second materials within the mold. In another embodiment, the molded part can include a first region having a first physical property and a second region having a second material property.

In one embodiment, an apparatus for injection molding a part includes a first hopper to hold a first material, a second hopper to hold a second material, a mold including a first gate and a second gate, a first barrel coupled to the first hopper and positioned between the first hopper and the first gate, a second barrel coupled to the second hopper and positioned between the second hopper and the second gate and an injector controller, coupled to both barrels and configured to coordinate the injection of materials from the first and second barrels into the mold.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

The various aspects, embodiments, implementations or features of the described embodiments can be used separately or in any combination.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

A method and apparatus is described for injection molding. The process can produce a molded part using at least two materials. In one embodiment, the materials can be plastic resins. The two materials can also have different physical properties from each other, especially after the materials have been used for making injection molded parts. For example a first material, although similar to second, can produce a stiffer molded part through the addition of an effective amount of glass filler.

An apparatus is provided that enables the simultaneous injection of a first and a second material into a mold. The first and second materials can have associated flow fronts within the injection mold. Through controlling the flow fronts, the position of the first and second materials can at least be partially controlled within the mold. Controlling the position of the materials can allow a designer to control at least partially the position of the different material, and hence the position of different physical properties in the final molded product. In other words, controlling the position of the materials within the final product can enable the designer to create a product with area specific physical properties.

Figure 1:
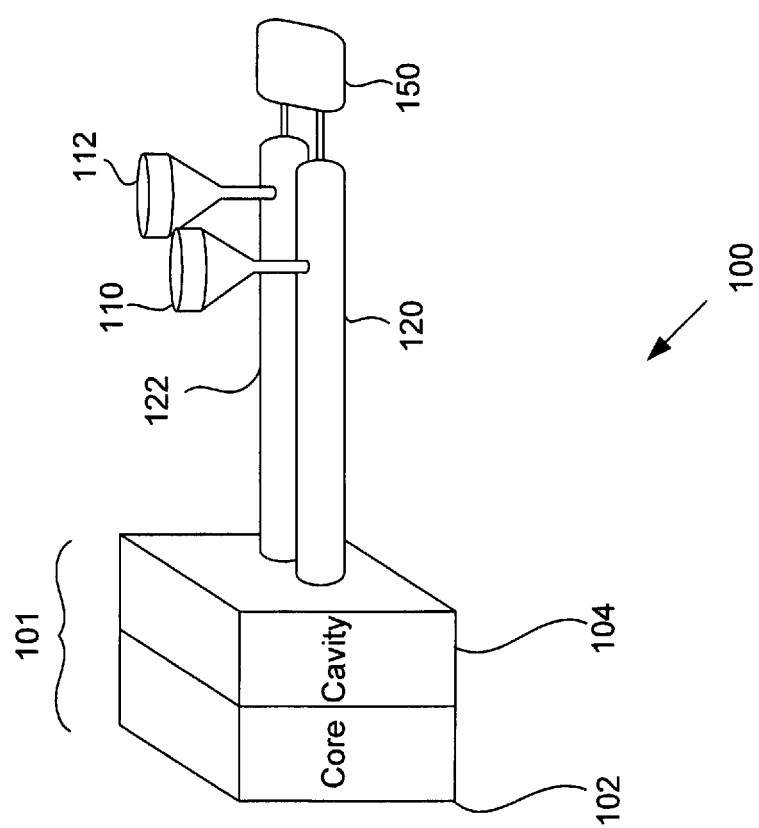
FIG. 1 shows one embodiment of an injection molding system in accordance with the specification.

FIG. 1 shows one embodiment of an injection molding system 100 in accordance with the specification. Injection mold 101 can include two pieces. The mold 101 pieces are commonly referred to as a cavity 104 and a core 102. Other embodiments may include more than two mold pieces. Typically, the cavity 104 and core 102 are brought together before material for molding is heated and injected. The cavity 104 and core 102 can later separate, after the molding material cools, enabling the finished part to be ejected from the mold. Hopper 110 can hold a first material and hopper 112 can hold a second material. In one embodiment, first and second materials can be gravity fed from hoppers 110 and 112 into appropriate barrels. Barrels can be used to process the injection molding material by mixing, heating and finally injecting material into the mold 101. Returning to FIG. 1, a first barrel 120 can mix, heat and inject material from hopper 110 into the injection mold while a second barrel 122 can mix, heat and inject the material from hopper 112 into the mold 101.

In one embodiment, the first and second materials can be injected relatively simultaneously. That is, both barrels can heat, mix and inject both materials at substantially the same time. In one embodiment, an injection controller 150 can be coupled to the first barrel 120 and the second barrel 122. The injection controller 150 can be used to coordinate the injection of the materials from the first 120 and second 122 barrels. For example, the injection controller 150 can cause the first barrel 120 and the second barrel 122 to simultaneously inject molding material into the mold 101. Simultaneously injecting two materials advantageously produces a single, homogenous part with comprised of two different materials. In one embodiment, each material can possess unique physical properties. In one embodiment, there is no visual difference between the first material and the second material in the injection molded part. In other words, although two different materials are used, the resulting part can have no visible delineation between the two materials (no break lines), the final part appearing as a smooth, continuous part. This is achievable, for example, when the both the first and second materials are plastic resins, but one of the two materials can have an additional filler. The introduction of the filler can affect the physical properties of the molded part, particularly in the region in the molded part including the filler material.

Figure 2A:
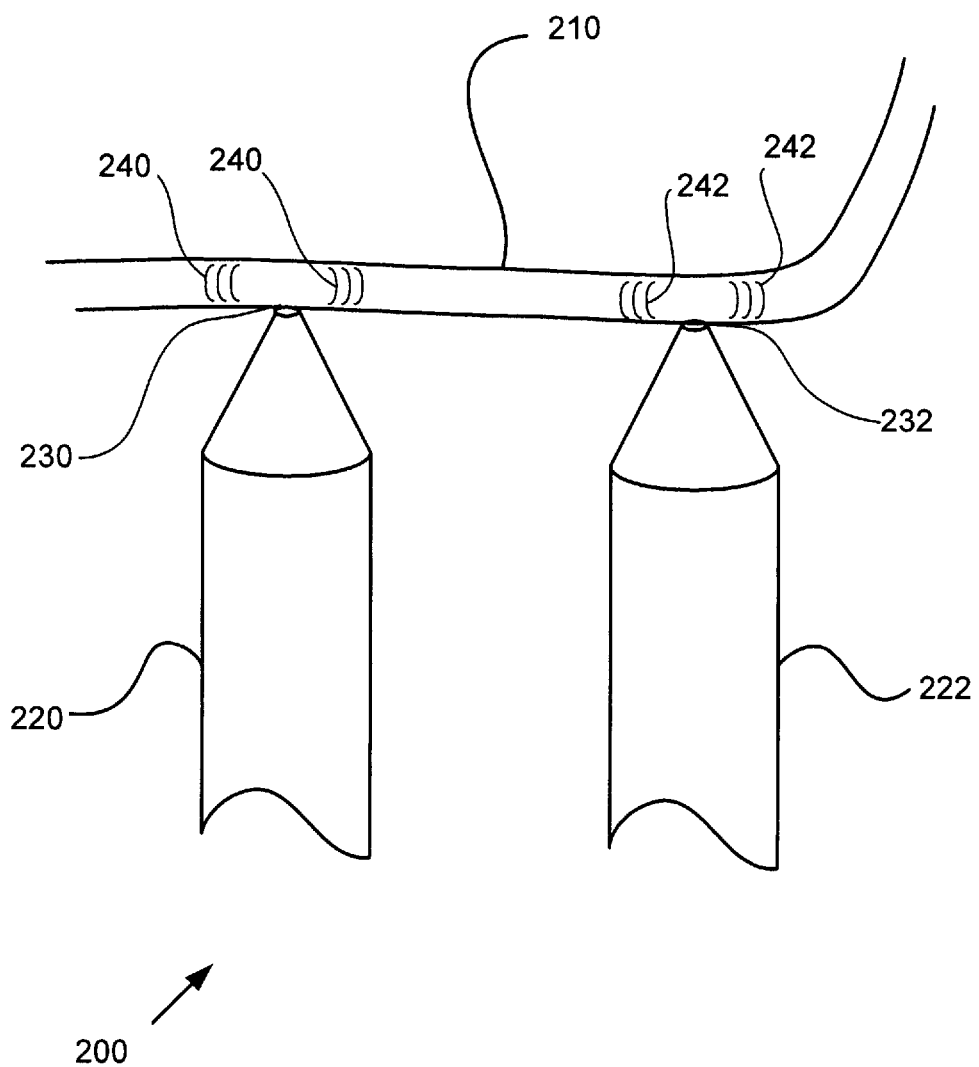
FIGS. 2A and 2B show a simplified view of a portion of an injection molding system, in accordance with the specification.

Injection molded material is typically introduced through "gates" in an injection mold. FIG. 2A shows a simplified view of a portion of an injection molding system 200, in accordance with the specification. In this illustration, the cavity/core mold 101 from FIG. 1 unit is shown in a simplified manner as mold 210. FIG. 2A is further simplified by showing only two gates 230 and 232. Other embodiments and systems can include more than two gates. A first barrel 220 is coupled to the first gate 230 and a second barrel is coupled to the second gate 232. The first barrel 220 can convey the first material and the second barrel 222 can convey the second material to the mold 210. In other words, material is injected from barrels 220 and 222 through respective gates 230 and 232 into the mold 210.

Positioning of the gates 230 and 232 with respect to the mold 210 can aid in controlling the position of the first and second material within the mold. As material is injected through the gates, the material moves through the mold by pushing forward "flow fronts". Flow front 240 illustrates the position of material from gate 230 and flow front 242 illustrates the position of material from gate 232. As shown in FIG. 2a, the flow fronts are relatively close to the gates. This condition (position of flow fronts 240 and 242) can occur when the first and second materials are initially injected into the mold 210.

Figure 2B:
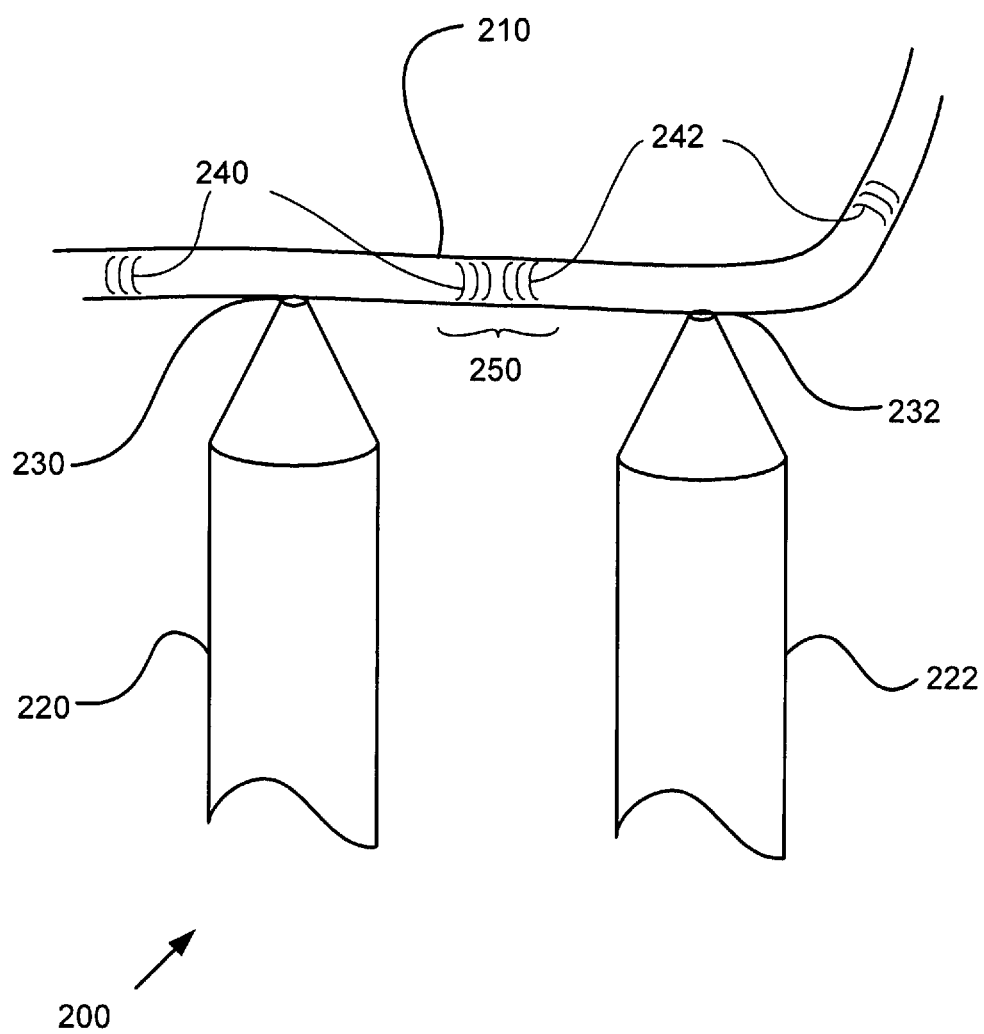

FIG. 2B shows the progress of the flow fronts 240, 242 in the mold 210. As more material is injected, the flow fronts 240, 242 progress further into the mold 210. Eventually, the flow fronts 240, 242 from the gates 230 and 232 will contact each other and form an interface region 250.

When the first material and the second material are similar resins, there may be no visible delineation at or near the interface region 250. In one embodiment, the first material can be a plastic resin with a glass filler and the second material can be a substantially similar polymer resin to the first material, but without a glass filler. A molded part that can be produced with these first and second materials and molding system 200 can appear as a smooth and uniform part, but can be comprised by two different materials, each material having physical properties. The first material can have at least one physical property different from the second material.

A plastic part can have physical properties, typically related to the particular plastic resin used for molding. One common method to change the physical properties of a molded part is to add certain compounds to the plastic resins, prior to melting and molding (for example, the glass filler mentioned above). Thus, the physical properties of a plastic part can generally be controlled by selecting and adding compounds to the plastic resin used for the molding process. Although only one characteristic has been discussed (increasing stiffness though the addition of a glass filler to the plastic resin), other characteristics may be changed in a similar manner. By way of example and not limitation, other filler examples are wood flour, calcium carbonate and aluminum powder. Also, other physical characteristics may be characterized other than strength. Other physical properties of interest can be tensile strength, flexural strength, hardness, compressive strength, impact strength among many others.

Thus, by selecting two materials (such as two different compounds of plastic resins), and simultaneously injecting both materials into a mold, a visually continuous part can be made, with separate regions, each having different physical properties.

Figure 3:
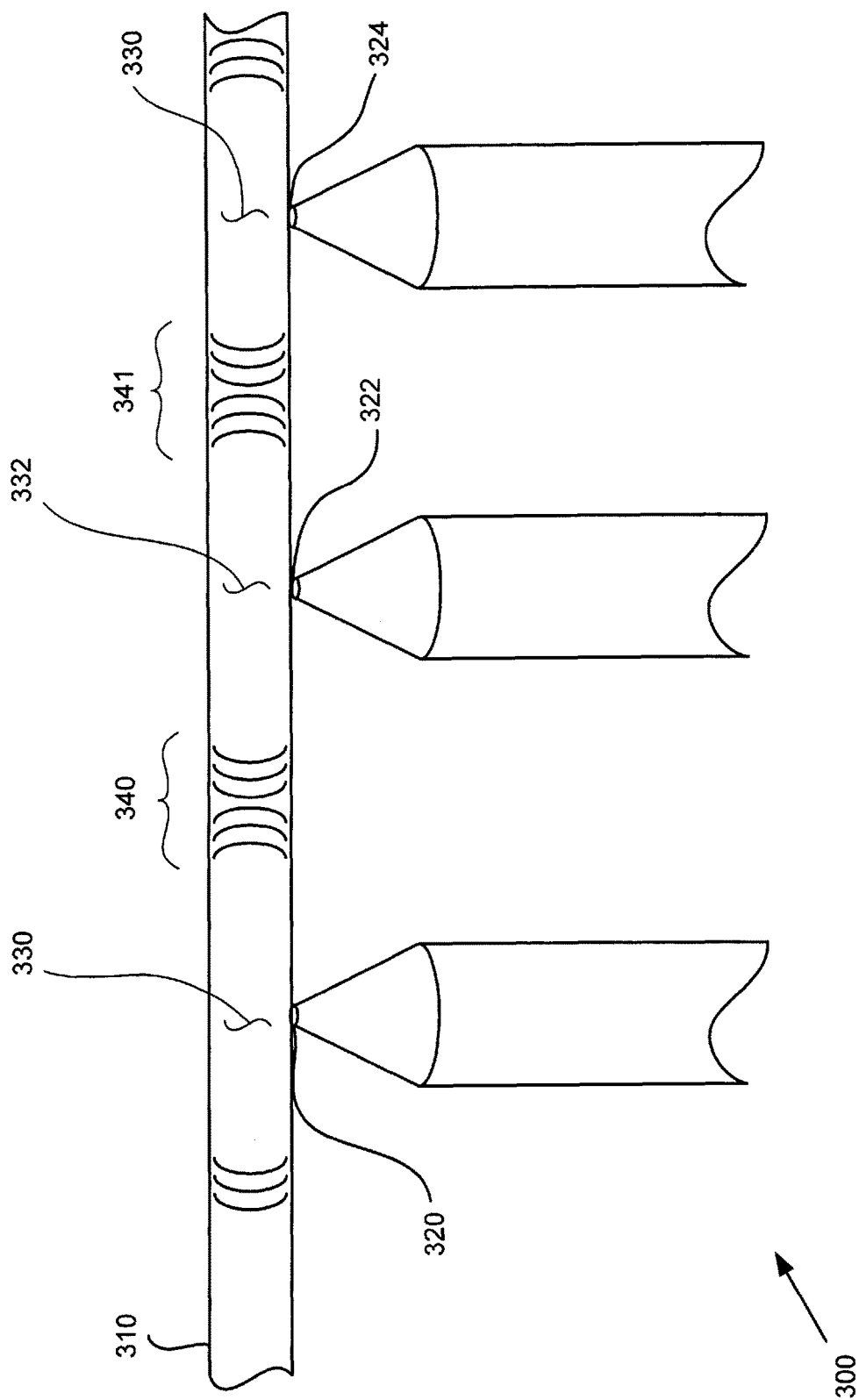
FIG. 3 shows another embodiment of an injection molding system in accordance with the specification.

FIG. 3 shows another embodiment of an injection molding system 300 in accordance with the specification. The system 300 includes a mold 310, a first gate 320, a second gate 322 and a third gate 324. A first material 330 is injected into the mold 310 through gate 320 and 324. A second material 332 is injected into the mold 310 through gate 322. As shown, the first material 330 is positioned in regions near the gates 320 and 324 while the second material 332 is positioned near the gate 322. Other embodiments can have more gates and can use more than two materials.

The position of the gates 320, 322 and 324 with respect to the mold 310 as well as injection characteristics such as injection pressure, material temperature and working viscosity can determine how the flow fronts of the material form, propagate, and, ultimately form interface regions 340 and 341. Position of the interface regions 340 and 341 in the mold 310 can determine the final position of the materials 330 and 332 in the injection molded part. Thus, by controlling the flow fronts of the injected material, a designer can control the position of the materials in the final injection molded part. If the first material 330 has different physical properties than the second material 332, then different regions (related to the first material 330 and the second material 332) of the injection molded part can possess the physical properties related to the injected material.

Figure 4:
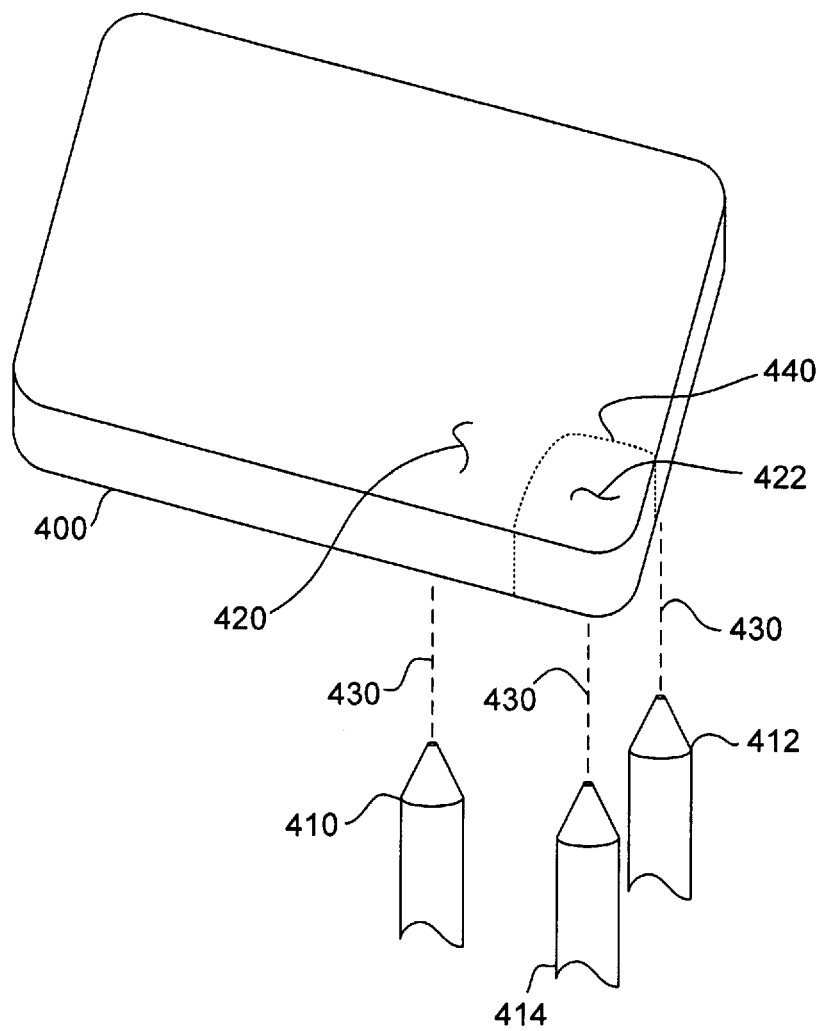
FIG. 4 shows an exemplary injection molded part 400 made in accordance with the specification; and, FIG. 5 is a flowchart of method steps for molding a part with non-uniform physical properties in accordance with the specification.

FIG. 4 shows an exemplary injection molded part 400 made in accordance with the specification. Although the mold that produces part 400 is not shown for clarity, exemplary sprues 410, 412 and 414 are shown (sprues can be coupled to gates on the mold and may be disposed between barrels such as barrel 220 and gates such as gate 230). Furthermore, the sprues 410, 412 and 414 are illustrated as they may be positioned relative to each other and with respect to the mold. The dashed lines 430 from the sprues 410, 412 and 414 to the part 400 illustrate the relationship between regions on the part 400 and the sprues 410, 412 and 414. Thus, region 420 can be related to material from sprues 410 and 412, while the region 422 within the dashed line can be attributed to material from sprue 414.

For example, if the bulk of part 400, requires stiffness, while a section of the part requires relatively more flexibility than the bulk, then the material comprising region 420 can be made relatively stiffer than region 422. In one embodiment, if a plastic resin is used for both regions 420, 422, a glass filler can be added to the polymer used in region 420 to add stiffness.

Continuing this example, by using similar materials with different physical properties (at least one physical property differs between the similar materials), a molded part can be produced with at least two regions, each region with a different physical property. Furthermore, since the two materials are injected into the mold relatively simultaneously, the resulting molded part can appear smooth, uniform and continuous, even across interface region 440. Through the positioning of gates with respect to the mold and controlling the flow fronts of the materials injected into the mold, the position of multiple regions within the final molded part can be determined.

Injection molded parts produced as described herein can have several advantages. Regions of different physical properties can be positioned to enhance the performance of molded parts. For example, if a corner of a molded part can be subject to impacts, the designer may want that corner to be composed of a relatively ductile material. However, the same molded part may require a relatively stiff (and perhaps less ductile) material in other regions. Using the methods described above, a single molded part can be injection molded with a ductile region (such as region 422 in FIG. 4) and a relatively stiffer region (such as region 420 in FIG. 4). The stiffness and/or ductility of the regions can be controlled by adding effective amounts of filler to plastic resins that can be selected for the injection molded part. Also, since the two materials are injected substantially simultaneously into the mold, the resulting molded part can have a uniform, smooth appearance with no delineation between materials.

Figure 5:
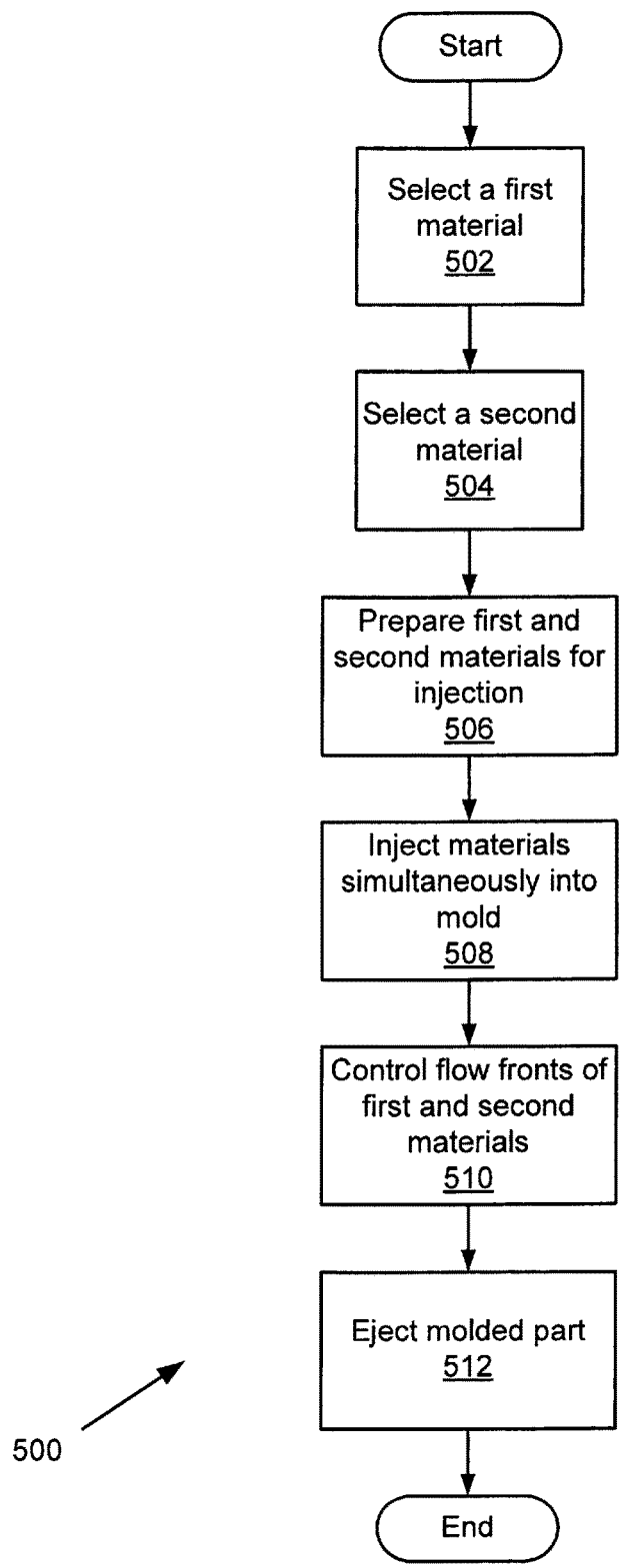

FIG. 5 is a flowchart of method steps 500 for molding a part with non-uniform material properties in accordance with the specification. Persons skilled in the art will understand that any system configured to perform the method steps in any order is within the scope of this description.

The method begins in step 502 where a first material is selected. In step 504, a second material is selected. Often times, the first material and the second material can both be plastic resins. The first material can differ from the second material by the addition of a component meant to change at least one physical property after the material has melted and cooled (i.e., after molding). For example, a glass filler can be added to the first material to affect the stiffness of the molded part where the first material is disposed.

In step 506, the first and second materials are prepared for injection. In one embodiment, the materials are mixed, placed in hoppers, fed from hopper and heated. Often, the materials are heated in the barrels such as barrels 120 and 122 shown in FIG. 1. In Step 508, the first and second materials are relatively simultaneously injected into the mold 101. The term relatively simultaneously is used to indicate that both materials are injected into the mold at substantially the same time. In step 510, the flow fronts of the first material and the second material are controlled. Controlling the flow fronts allows the designer to control the position of the first and second materials with respect to the molded part. After the heated material cools, in step 512, the molded part is ejected from the mold. Since two different materials with two different physical properties are selected, the resulting part can have two or more regions, each region with a characteristic physical property related to the material selected in steps 502 and 504. The method then ends.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A structure for an electronic device comprising a plurality of corners separated by side walls, the structure comprising:
   a low impact region corresponding to at least the side walls of the structure, the low impact region comprised of a low ductility resinous material that includes a stiffening agent; and
   a plurality of high impact regions corresponding to the plurality of corners of the structure, each of the high impact regions contiguous with and separated from each other by the low impact region, each of the high impact regions comprising a high ductility resinous material that includes substantially no stiffening agent, wherein the high impact regions are characterized as each having a greater ductility than the low impact region, wherein the low impact region is characterized as having a greater stiffness than each of the high impact regions, wherein during an injection molding process for forming the structure, the low and high ductility resinous materials are simultaneously injected into a mold such that interface regions between the low and high ductility resinous materials are uniform and continuous across the interface regions with no visible delineation between the low and high ductility resinous materials.

2. The structure of claim 1, wherein the stiffening agent comprises at least one of glass, wood, calcium carbonate and aluminum powder.

3. The structure of claim 1, wherein the high impact regions are characterized as having ductility sufficient to withstand impact at the corners without breakage.

4. The structure of claim 1, wherein the structure is supportive frame of the electronic device.

5. The structure of claim 1, wherein the low ductility resinous material includes a first resin and the high ductility resinous material includes a second resin, wherein the first resin is substantially the same as the second resin.

6. The structure of claim 1, wherein the low ductility resinous material includes a first resin and the high ductility resinous material includes a second resin different than the first resin.

7. The structure of claim 1, wherein a stiffness of the low impact region is related to an amount of stiffening agent within the low ductility resinous material.

8. A structure as part of an electronic device, the structure comprising:
a bulk region including a first material characterized as having a first stiffness and a first ductility, wherein the first material includes a stiffening agent; and
a plurality of corner regions separated by and continuous with the bulk region, each of the plurality of corner regions including a second material characterized as having a second stiffness and a second ductility, the second material including substantially no stiffening agent,
wherein the first stiffness is greater than the second stiffness and the second ductility is greater than the first ductility,
wherein during an injection molding process for forming the structure, the first and second materials are simultaneously injected into a mold such that interface regions between the bulk region and each of the plurality of corner regions are uniform and continuous across the interface regions with no visible delineation between the first and second materials.

9. The structure of claim 8, wherein the first material includes a first resin and the second material include a second resin.

10. The structure of claim 9, wherein the first resin is the same as the second resin.

11. The structure of claim 9, wherein the first resin is different than the second resin.

12. The structure of claim 8, wherein the stiffening agent comprises a glass filler.

13. The structure of claim 8, wherein the stiffening agent includes at least one of glass filler, wood flour, calcium carbonate and aluminum powder.

14. The structure of claim 8, wherein the first material is characterized as having a hardness greater than a hardness of the second material.

15. The structure of claim 8, wherein the second material is characterized as having a tensile strength greater than a tensile strength of the first material.

16. The structure of claim 8, wherein the second material is characterized as having a flexural strength greater than the first material.

17. A structure as part of an electronic device, the structure comprising a plurality of corners separated by side walls, the structure comprising:
a low impact region corresponding to at least the side walls of the structure, the low impact region comprised of a low flexural strength material that includes a glass filler; and
a plurality of high impact regions corresponding to the plurality of corners of the structure, each of the high impact regions contiguous with and separated from each other by the low impact region, each of the high impact regions comprising a high flexural strength material that includes substantially no glass filler,
wherein the high impact regions are characterized as each having a greater flexural strength than the low impact region, wherein the low impact region is characterized as having a greater stiffness than each of the high impact regions,
wherein during an injection molding process for forming the structure, the low and high flexural strength materials are simultaneously injected into a mold such that interface regions between the low and high impact regions are uniform and continuous across the interface regions with no visible delineation between the low and high flexural strength materials.

18. The structure of claim 17, wherein the low flexural strength material further includes at least one of wood flour, calcium carbonate or aluminum powder.

19. The structure of claim 17, wherein the low flexural strength material includes a first resin and the high flexural strength material includes a second resin, the first resin substantially the same as the second resin.

20. The structure of claim 17, wherein the low flexural strength material includes a first resin and the high flexural strength material includes a second resin, the first resin different than the second resin.

* * * * *